United States Patent
Kim et al.

(10) Patent No.: US 11,121,706 B1
(45) Date of Patent: Sep. 14, 2021

(54) DUTY CYCLE CORRECTION CIRCUIT AND SEMICONDUCTOR SYSTEM

(71) Applicant: SK hynix Inc., Icheon-si (KR)

(72) Inventors: Kwang Soon Kim, Icheon-si (KR); Noh Hyup Kwak, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/084,117

(22) Filed: Oct. 29, 2020

(30) Foreign Application Priority Data

May 21, 2020 (KR) .................. 10-2020-0060962

(51) Int. Cl.
| | |
|---|---|
| *H03K 3/017* | (2006.01) |
| *H03K 5/151* | (2006.01) |
| *G11C 7/22* | (2006.01) |
| *G11C 11/4076* | (2006.01) |
| *H03K 5/156* | (2006.01) |

(52) U.S. Cl.
CPC ............ *H03K 3/017* (2013.01); *G11C 7/222* (2013.01); *G11C 11/4076* (2013.01); *H03K 5/151* (2013.01); *H03K 5/1565* (2013.01)

(58) Field of Classification Search
None
See application file for complete search history.

(56) References Cited

U.S. PATENT DOCUMENTS

| | | | |
|---|---|---|---|
| 9,985,619 B2 * | 5/2018 | Lee | .............. H03K 5/1565 |
| 10,218,343 B1 * | 2/2019 | Tomar | .............. G11C 7/222 |
| 10,284,182 B2 | 5/2019 | Modi et al. | |

FOREIGN PATENT DOCUMENTS

KR 1020190029056 A 3/2019

* cited by examiner

*Primary Examiner* — Cassandra F Cox
(74) *Attorney, Agent, or Firm* — William Park & Associates Ltd.

(57) ABSTRACT

A duty cycle correction circuit may include a data alignment circuit, a correction value generation circuit, and a dock generation circuit. The data alignment circuit may align unit pattern data based on a strobe clock signal. The correction value generation circuit may generate a duty correction value by measuring the amount of charges corresponding to the aligned data. The clock generation circuit may correct the duty ratio of the strobe clock signal based on the duty correction value.

18 Claims, 10 Drawing Sheets

FIG. 2
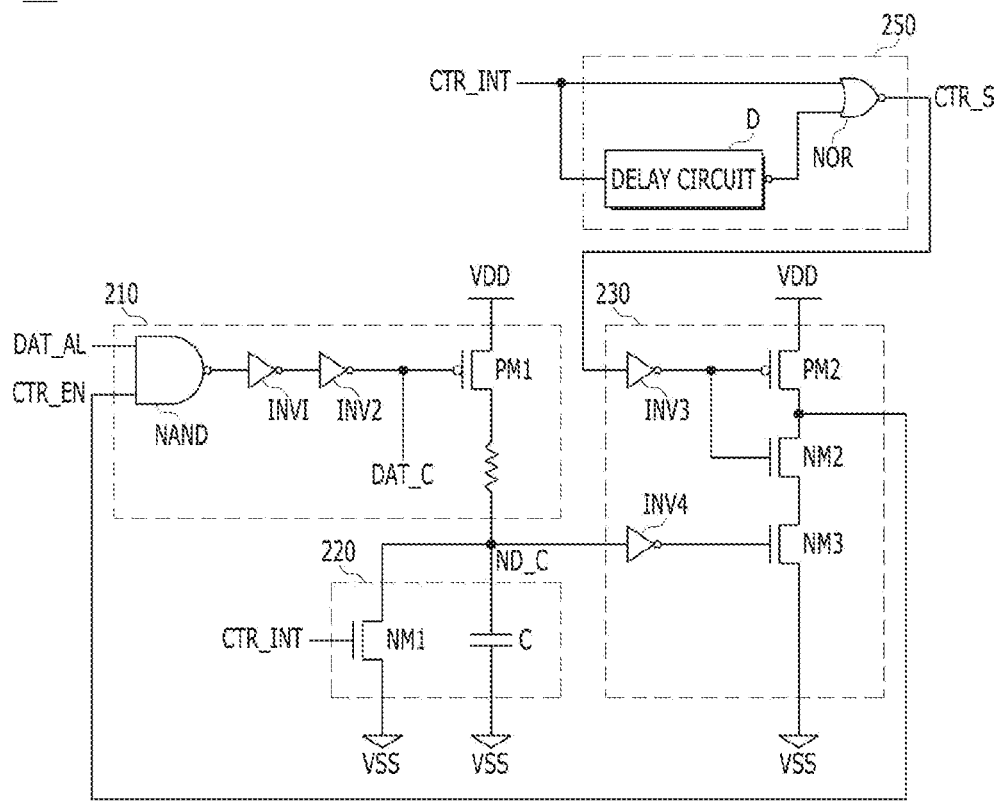
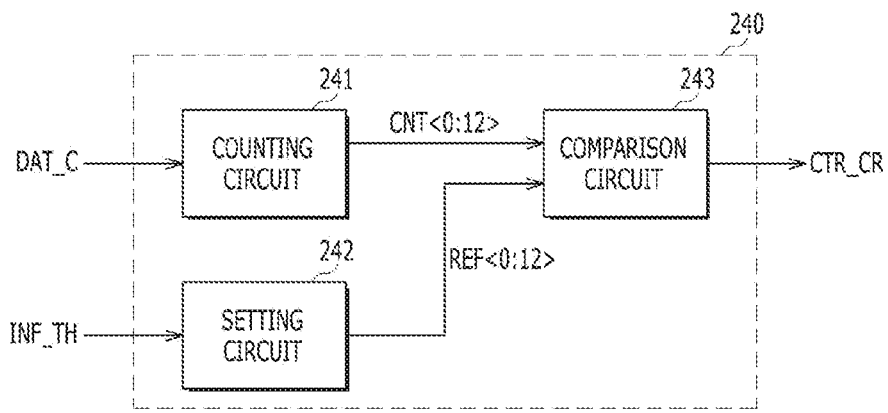

DUTY CYCLE CORRECTION CIRCUIT AND SEMICONDUCTOR SYSTEM

CROSS-REFERENCES TO RELATED APPLICATION

The present application claims priority under 35 U.S.C. § 119(a) to Korean application number 10-2020-0060962, filed on May 21, 2020, in the Korean Intellectual Property Office, which is incorporated herein by reference in its entirety.

BACKGROUND

1. Technical Field

Various embodiments generally relate to a duty cycle correction circuit and a semiconductor system, and more particularly, to a duty cycle correction circuit and a semiconductor system capable of correcting the duty ratio of a strobe clock signal.

2. Related Art

In general, a semiconductor memory device, including a double data rate synchronous DRAM (DDR SDRAM), receives external data in synchronization with a clock, stores the received data, and outputs data stored therein to the outside of the semiconductor memory device in synchronization with a clock.

The data rate of the semiconductor memory device is divided into a single data rate (SDR) and a double data rate (DDR) depending on a method of a clock that synchronizes data. Among them, the SDR method inputs and outputs data based on the rising edge of a dock. The DDR method inputs and outputs data based on each of the rising edge and falling edge of a dock.

In other words, the DDR method inputs and outputs data twice in one cycle of a clock and thus can process more than twice as much data as the SDR method although clocks having the same frequency are used. That is, the DDR method has an operating speed more than twice higher than the operating speed of the SDR method with respect to data input and output.

In the DDR method, it is the most important to maintain the duty ratio of a clock to 50:50 because both the rising edge and falling edge of the clock are used. That is, the most ideal form is that a logic "high" section corresponding to the rising edge of a clock and a logic "low" section corresponding to the falling edge of the clock are 50:50. If the duty ratio of a clock is 50:50, the best operation efficiency can be guaranteed in processing subsequent data because the valid window of data input and output in synchronization with the clock is a maximum.

If the duty ratio of a clock is not 50:50 but 70:30 or 30:70 due to a jitter component within a circuit or process spreading, reliability of data input and output in synchronization with the clock cannot be guaranteed. Accordingly, a "duty cycle correction circuit" is needed for correcting the duty ratio of a clock.

The operating speed of various electronic devices, including semiconductor memory device, are becoming gradually higher due to the needs of users. The higher operating speed means that the frequency of a dock gradually becomes higher. Accordingly, it becomes difficult to measure and correct the duty ratio of a clock as the frequency of the clock becomes higher.

SUMMARY

Various embodiments are directed to a duty cycle correction circuit, which can align measurement data, inserted into unit pattern data, in a strobe clock signal and measure and correct the duty ratio of the strobe clock signal through a charging operation and a counting operation based on the aligned measurement data.

Also, various embodiments are directed to a duty cycle correction circuit, which can generate a duty correction value for each of a plurality of strobe clock signals and correct the duty ratio of each of the plurality of strobe clock signals through a comparison and analysis for the duty correction values.

Also, various embodiments are directed to a duty cycle correction circuit, which can perform a charging operation and a counting operation for generating a duty correction value, based on aligned measurement data.

Objects of the present disclosure are not limited to the aforementioned objects, and other objects not described above may be evidently understood by those skilled in the art, to which the present disclosure pertains, from the following description.

In an embodiment, a duty cycle correction circuit may include a data alignment circuit suitable for receiving unit pattern data into which at least one measurement data has been inserted and aligning the unit pattern data based on a strobe clock signal, a correction value generation circuit suitable for counting a section from time at which a duty measurement operation is entered to time at which charges for charging corresponding to the measurement data aligned by the data alignment circuit are stored by a preset value and outputting the section as a duty correction value, and a clock generation circuit suitable for generating the strobe clock signal and correcting a duty ratio of the strobe clock signal based on the duty correction value.

In an embodiment, a duty cycle correction circuit may include a data alignment circuit suitable for receiving unit pattern data into which at least one measurement data has been inserted in response to first and second strobe clock signals corresponding to the rising edge and falling edge of a strobe clock signal, respectively, and aligning the unit pattern data based on the first and second strobe clock signals, respectively, a correction value generation circuit suitable for counting a section from time at which a duty measurement operation is entered to time at which charges for charging corresponding to the measurement data aligned by the first and second strobe clock signals, respectively, are stored by a preset value and outputting the counted section as a duty correction value, and a clock generation circuit suitable for generating the first and second strobe clock signals and correcting duty ratios of the first and second strobe clock signals based on the duty correction value.

In an embodiment, a duty cycle correction circuit may include a data alignment circuit suitable for continuously receiving unit pattern data into which at least one measurement data has been inserted, based on a plurality of strobe clock signals having different phases, respectively, and aligning the unit pattern data based on the plurality of strobe clock signals, respectively, a correction value generation circuit suitable for counting a section from time at which a duty measurement operation is entered to time at which charges for charging corresponding to the measurement data aligned by the plurality of strobe clock signals, respectively, are stored by a preset value and outputting the counted section as a duty correction value, and a clock generation circuit suitable for generating the plurality of strobe clock signals and correcting duty ratios of the plurality of strobe clock signals based on the duty correction value.

In an embodiment, a semiconductor system may include a host device suitable for outputting a command signal and data and providing system clock information and a semiconductor device suitable for generating a strobe clock signal based on the system clock information, continuously receiving unit pattern data, into which at least one measurement data has been inserted and aligning the unit pattern data based on the strobe clock signal, upon duty measurement operation, and generating a duty correction value for correcting a duty ratio of the strobe clock signal through a charging operation and a counting operation using the aligned measurement data.

BRIEF DESCRIPTION OF THE DRAWINGS

FIG. 2 is a diagram illustrating a configuration of a correction value generation circuit illustrated in FIG. 1.

DETAILED DESCRIPTION

The description of the present disclosure is an embodiment for a structural and/or functional description. The scope of the present disclosure should not be construed as being limited to embodiments described in the specification. That is, the scope of the present disclosure should be understood as including equivalents, which may realize the technical spirit, because an embodiment may be modified in various ways and may have various forms. Furthermore, objects or effects proposed in the present disclosure do not mean that a specific embodiment should include all objects or effects or include only such effects. Accordingly, the scope of the present disclosure should not be understood as being limited thereby.

The meaning of terms described in this application should be understood as follows.

The terms, such as the "first" and the "second", are used to distinguish one element from another element, and the scope of the present disclosure should not be limited by the terms. For example, a first element may be named a second element. Likewise, the second element may be named the first element.

An expression of the singular number should be understood as including plural expressions, unless clearly expressed otherwise in the context. The terms, such as "include" or "have", should be understood as indicating the existence of a set characteristic, number, step, operation, element, part, or a combination thereof, not excluding a possibility of the existence or addition of one or more other characteristics, numbers, steps, operations, elements, parts, or a combination thereof.

In each of steps, symbols (e.g., a, b, and c) are used for convenience of a description, and the symbols do not describe order of the steps. The steps may be performed in order different from order described in the context unless specific order is clearly described in the context. That is, the steps may be performed according to described order, may be performed substantially at the same time as the described order, or may be performed in reverse order of the described order.

All the terms used herein, including technological or scientific terms, have the same meanings as those that are typically understood by those skilled in the art, unless otherwise defined. Terms defined in commonly used dictionaries should be construed as having the same meanings as those in the context in related technology and should not be construed as having ideal or excessively formal meanings, unless clearly defined in the application.

Figure 1:
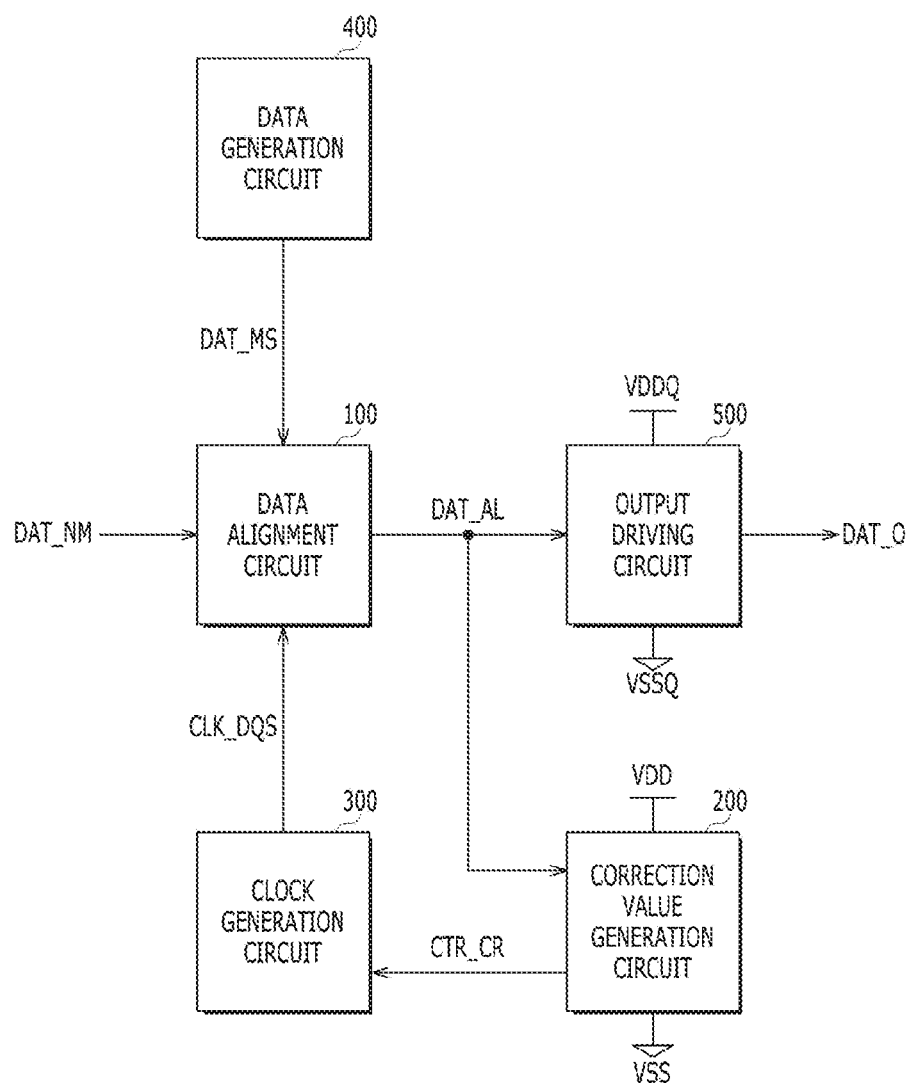
FIG. 1 is a block diagram illustrating a configuration of a semiconductor device according to an embodiment.

FIG. 1 is a block diagram for illustrating a configuration of a semiconductor device according to an embodiment.

Referring to FIG. 1, the semiconductor device may include a data alignment circuit 100, a correction value generation circuit 200, and a clock generation circuit 300. The semiconductor device may further include a data generation circuit 400 and an output driving circuit 500.

First, the data alignment circuit 100 may be an element for receiving unit pattern data DAT_MS into which at least one measurement data has been inserted and aligning the unit pattern data DAT_MS based on a strobe clock signal CLK_DQS.

More specifically, the data alignment circuit 100 may be used for both a normal operation and a duty measurement operation. In this case, the normal operation means an operation of outputting data from the semiconductor device to the outside of the semiconductor device. The duty measurement operation means an operation of measuring the duty ratio of the strobe clock signal CLK_DQS.

Accordingly, upon normal operation, the data alignment circuit 100 may receive normal data DAT_NM and align the normal data DAT_NM based on the strobe clock signal CLK_DQS. Furthermore, aligned data DAT_AL output by the data alignment circuit 100 may be output to the outside of the semiconductor device by the output driving circuit 500 to be described later. Furthermore, upon duty measurement operation, the data alignment circuit 100 may receive the unit pattern data DAT_MS and align the unit pattern data DAT_MS based on the strobe clock signal CLK_DQS.

Furthermore, the aligned data DAT_AL output by the data alignment circuit 100 may be used for the correction value generation circuit 200 to be described later to measure and correct the duty ratio of the strobe clock signal CLK_DQS.

As described above, there may be given an example in which upon duty measurement operation, the data alignment circuit 100 receives the unit pattern data DAT_MS through the data generation circuit 400. Additionally, upon duty measurement operation, the data alignment circuit 100 may receive the unit pattern data DAT_MS instead of the normal data DAT_NM through an input stage different from an input stage to which the unit pattern data DAT_MS is input, for example, an input stage to which the normal data DAT_NM is input.

At least one measurement data may be inserted into the unit pattern data DAT_MS input to the data alignment circuit 100. The unit pattern data DAT_MS is more specifically described with reference to FIG. 3.

The correction value generation circuit 200 may be an element for generating a duty correction value CTR_CR through a charging operation and a counting operation, based on measurement data inserted into the aligned data DAT_AL.

More specifically, the correction value generation circuit 200 may store charges for charging based on measurement data aligned by the data alignment circuit 100. Furthermore, the correction value generation circuit 200 may count, based on the aligned measurement data, a section from time at which a duty measurement operation is entered to time at which the charges for charging are stored by a preset value. As used herein, the word "section" can refer to an interval in time. In this instance, for example, an interval from a time at which a duty measurement operation is entered to a time at which the charges for charging are stored by a preset value. Furthermore, the correction value generation circuit 200 may generate the duty correction value CTR_CR through a charging operation and a counting operation based on the aligned measurement data. A more detailed configuration and operation of the correction value generation circuit 200 are described in detail with reference to FIG. 2 below.

The clock generation circuit 300 may be an element for generating the strobe clock signal CLK_DQS. Furthermore, the clock generation circuit 300 may be an element for correcting the duty ratio of the strobe clock signal CLK_DQS based on the duty correction value CTR_CR generated by the correction value generation circuit 200.

The strobe clock signal CLK_DQS corrected based on the duty correction value CTR_CR may be input back to the data alignment circuit 100. Accordingly, the data alignment circuit 100 may align the normal data DAT_NM, input upon normal operation, based on the strobe clock signal CLK_DQS having a corrected duty ratio of 50:50.

As described above, the data alignment circuit 100, the correction value generation circuit 200, and the clock generation circuit 300 may measure and correct the duty ratio of the strobe clock signal CLK_DQS. Accordingly, in an embodiment of the present disclosure, the data alignment circuit 100, the correction value generation circuit 200, and the clock generation circuit 300, which are described above, may be defined as a "duty cycle correction circuit."

The data generation circuit 400 may be an element for continuously generating the unit pattern data DAT_MS upon duty measurement operation.

More specifically, upon duty measurement operation, the data generation circuit 400 may generate the unit pattern data DAT_MS based on an internal clock signal (not illustrated), for example. Furthermore, the data generation circuit 400 may provide the generated unit pattern data DAT_MS to the data alignment circuit 100. In this case, the unit pattern data DAT_MS may be preset data. The unit pattern data DAT_MS is described in more detail later with reference to FIG. 3.

The output driving circuit 500 may be an element for receiving the aligned data DAT_AL output from the data alignment circuit 100 and driving and outputting the aligned data DAT_AL in a preset voltage level.

More specifically, the output driving circuit 500 may receive a first supply power voltage VDDQ and a first ground power voltage VSSQ. Accordingly, upon normal operation, the output driving circuit 500 may drive the aligned data DAT_AL at the first supply power voltage VDDQ and the first ground power voltage VSSQ based on a logic level of the aligned data DAT_AL. Accordingly, the output driving circuit 500 may output, to the outside of the semiconductor device, final data DAT_O driven at the first supply power voltage VDDQ and the first ground power voltage VSSQ.

Upon data output operation, the output driving circuit 500 may require relatively greater driving power. Accordingly, there may be given an example in which the output driving circuit 500 receives the first supply power voltage VDDQ and the first ground power voltage VSSQ, separately from power applied to a peripheral circuit, as described above. Additionally, the output driving circuit 500 may receive a second supply power voltage VDD and second ground power voltage VSS, applied to the peripheral circuit, depending on the design.

FIG. 2 is a diagram for illustrating a configuration of the correction value generation circuit 200 illustrated in FIG. 1.

Referring to FIG. 2, the correction value generation circuit 200 may include an input circuit 210, a charging circuit 220, a detection circuit 230, and a processing circuit 240. The correction value generation circuit 200 may further include an initialization circuit 250.

First, the input circuit 210 may be an element for receiving the aligned data DAT_AL in the enable section of an enable signal CTR_EN. The input circuit 210 may generate an output signal DAT_C to be provided to the processing circuit 240, which is to be described later, through an internal circuit. Furthermore, the input circuit 210 may generate charges for charging provided to the charging circuit 220, which is to be described later, through the internal circuit.

More specifically, the input circuit 210 may include a NAND gate NAND to which the aligned data DAT_AL and the enable signal CTR_EN are input, a first inverter INV1 coupled to the output stage of the NAND gate NAND, a second inverter INV2 coupled to the output stage of the first inverter INV1, and a first PMOS transistor PM1 having a gate to which the output signal DAT_C of the second inverter INV2 is input.

In this case, the enable signal CTR_EN may be a signal enabled upon duty measurement operation. The enable signal CTR_EN, as will be described again with reference to FIG. 3, may be a signal enabled during a section from time at which the duty measurement operation is entered to time at which charges for charging corresponding to measurement data included in the aligned data DAT_AL are stored by a preset value.

Accordingly, the NAND gate NAND of the input circuit 210 may receive the aligned data DAT_AL in the enable section of the enable signal CTR_EN, and may output the received aligned data. The output signal of the NAND gate NAND may be output via the first inverter INV1 and the second inverter INV2. The output signal DAT_C of the second inverter INV2 may be transmitted to the first PMOS transistor PM1 and the processing circuit 240 to be described later. For reference, the output signal DAT_C of the second inverter INV2 may be a signal used for the charging operation of the charging circuit 220. Accordingly, the output signal DAT_C of the second inverter INV2 may be called "charging data DAT_C," for convenience of a following description.

The first PMOS transistor PM1 of the input circuit 210 may be turned on or off based on the charging data DAT_C. Upon turn-on operation, the first PMOS transistor PM1 may transmit charges for charging, corresponding to the charging data DAT_C, to the charging circuit 220, coupled to a charging node ND_C, through the drain stage of the first PMOS transistor PM1.

Through the aforementioned configuration, the input circuit 210 may provide the charging data DAT_C to the processing circuit 240 in the enable section of the enable signal CTR_EN. Furthermore, the input circuit 210 may provide charges for charging based on the charging data DAT_C to the charging circuit 220 in the enable section of the enable signal CTR_EN.

The charging circuit 220 may be an element for storing charges for charging corresponding to the charging data DAT_C output by the input circuit 210. The charging circuit 220 may be initialized based on an initialization signal CTR_INT.

More specifically, the charging circuit 220 may include a charging capacitor C coupled between the charging node ND_C and the second ground power voltage VSS and a first NMOS transistor NM1 coupled between the charging node ND_C and the second ground power voltage VSS and having a gate to which the initialization signal CTR_INT is input. In this case, the initialization signal CTR_INT may be a signal enabled based on time of entering a duty correction operation. The initialization signal CTR_IN may be a signal that shifts from a logic "high" to a logic "low" upon duty measurement operation, for example.

Accordingly, the first NMOS transistor NM1 of the charging circuit 220 may be turned on in response to the logic "high" of the initialization signal CTR_INT. At this time, the charging node ND_C may be initialized and driven at the second ground power voltage VSS. Furthermore, upon duty measurement operation, the first NMOS transistor NM1 may be turned off in response to the logic "low" of the initialization signal CTR_INT. At this time, the charging capacitor C may be charged based on charges for charging received through the charging node ND_C. Accordingly, a voltage level of the charging node ND_C may become higher depending on the charges for charging stored in the charging capacitor C.

In this case, the charging capacity of the charging capacitor C may be different depending on the design. The charging capacity of the charging capacitor C may be designed to be equal to or greater than a threshold voltage of a fourth inverter INV4 to be described later.

Through the aforementioned configuration, the charging circuit 220 may raise a voltage level of the charging node ND_C by charging the charging capacitor C with charges for charging output by the input circuit 210.

The detection circuit 230 may be an element for detecting time at which charges for charging stored in the charging circuit 220 are stored by a preset value and controlling the enable signal CTR_EN.

More specifically, the detection circuit 230 may include a third inverter INV3 to which a start signal CTR_S to be described later is input, a second PMOS transistor PM2 and second NMOS transistor NM2 having respective gates coupled to the output stage of the third inverter INV3, a fourth inverter INV4 having an input stage coupled to the charging node ND_C, and a third NMOS transistor NM3 having a gate coupled to the output stage of the fourth inverter INV4. In this case, the second PMOS transistor PM2, the second NMOS transistor NM2, and the third NMOS transistor NM3 may be coupled in series between the second supply power voltage VDD and the second ground power voltage VSS. Furthermore, the enable signal CTR_EN may be output from the common node of the second PMOS transistor PM2 and the second NMOS transistor NM2.

Prior to a more description of the detection circuit 230, the start signal CTR_S may be a signal having a logic-high pulse width upon duty measurement operation. The start signal CTR_S is more specifically described in the description of the initialization circuit 250 below.

Accordingly, upon duty measurement operation, the second PMOS transistor PM2 of the detection circuit 230 may be turned on based on the logic "high" of the start signal CTR_S. For reference, as can be seen in FIG. 2, the start signal CTR_S may be inverted through the third inverter INV3. The turn-on and turn-off operations of the second PMOS transistor PM2 and the second NMOS transistor NM2 may be controlled based on the output signal of the third inverter INV3. Accordingly, the enable signal CTR_EN may be enabled from a logic "low" to a logic "high" based on the logic "high" of the start signal CTR_S. Thereafter, the second PMOS transistor PM2 may be turned off based on the logic "low" of the start signal CTR_S. At this time, the second NMOS transistor NM2 may be turned on.

The charging capacitor C may store charges for charging corresponding to the charging data DAT_C in the state in which the second NMOS transistor NM2 has been turned on. At this time, a voltage level of the charging node ND_C may become higher than a voltage level of the charges for charging stored in the charging to capacitor C. Accordingly, when a voltage of the charging node ND_C becomes higher than a threshold voltage of the fourth inverter INV4, the third NMOS transistor NM3 may be turned on. At this time, the enable signal CTR_EN may be disabled from a logic "high" to a logic "low."

Through the aforementioned configuration, the detection circuit 230 may control enable time of the enable signal CTR_EN based on the start signal CTR_S. Furthermore, the detection circuit 230 may control disabling time of the enable signal CTR_EN based on time at which charges for charging stored in the charging node ND_C are stored by a preset value.

The processing circuit 240 may be an element for generating measurement counting values CNT<0:12> by counting aligned measurement data received during the enable section of the enable signal CTR_EN. Furthermore, the processing circuit 240 may be an element for generating the duty correction value CTR_CR by comparing the measurement counting values CNT<0:12> with preset reference counting values REF<0:12>. The processing circuit 240 may include a counting circuit 241, a setting circuit 242, and a comparison circuit 243.

First, the counting circuit 241 may be an element for generating the measurement counting values CNT<0:12> through a counting operation based on the charging data DAT_C. The counting circuit 241 may be configured as a counter including a plurality of shift registers, for example. Accordingly, the counting circuit 241 may perform a counting operation through a shifting operation based on the charging data DAT_C. In this case, the measurement counting values CNT<0:12> are configured as 13 bits, for example.

The setting circuit 242 may be an element for setting the reference counting values REF<0:12> based on a preset value, that is, threshold voltage information INF_TH corresponding to an actual threshold voltage of the fourth inverter INV4.

In this case, the reference counting values REF<0:12> may correspond to the number of toggled strobe clock signals CLK_DQS that is necessary for the strobe clock signal CLK_DQS, having a duty ratio of 50:50, to charge the charging capacitor C by a preset value. Accordingly, if the toggling number of 776, for example, is necessary for the strobe clock signal CLK_DQS, having a duty ratio of 50:50, to charge the charging capacitor C by a preset value, the number of reference counting values REF<0:12> may be set to 776.

In this case, the threshold voltage information INF_TH may have information corresponding to the toggling number of the strobe clock signal CLK_DQS, Accordingly, the setting circuit 242 may set the reference counting values REF<0:12> based on the threshold voltage information INF_TH.

The comparison circuit 243 may be an element for generating the duty correction value CTR_CR by comparing the measurement counting values CNT<0:12> with the reference counting values REF<0:12>, The comparison circuit 243 may generate the duty correction value CTR_CR by calculating a difference between the measurement counting values CNT<0:12> and the reference counting values REF<0:12>. In this case, the duty correction value CTR_CR may be a digital type code signal or analog type voltage signal, for example, which may include information for correcting the duty ratio of the strobe clock signal CLK_DQS.

Accordingly, if the number of measurement counting values CNT<0:12> is greater than 776 in the state in which the number of reference counting values REF<0:12> has been set to 776, the pulse width of the strobe clock signal CLK_DQS having a logic "high" may mean that the pulse width is smaller than a normal pulse width. In contrast, if the number of measurement counting values CNT<0:12> is smaller than 776, the pulse width of the strobe clock signal CLK_DQS having a logic "high" may mean that the pulse width is larger than the normal pulse width. Accordingly, the comparison circuit 243 may generate the duty correction value CTR_CR corresponding to a duty ratio of the strobe clock signal CLK_DQS by calculating a difference between the measurement counting values CNT<0:12> and the reference counting values REF<0:12>.

The comparison circuit 243 may input the generated duty correction value CTR_CR to the clock generation circuit 300 of FIG. 1. Furthermore, the clock generation circuit 300 may correct the duty ratio of the strobe clock signal CLK_DQS to 50:50 based on the duty correction value CTR_CR.

In this case, the clock generation circuit 300 may generate the strobe clock signal CLK_DQS by controlling a voltage or current or to controlling the number of driven transistors. That is, the clock generation circuit 300 may correct the duty ratio of the strobe clock signal CLK_DQS by controlling a voltage or current or controlling the number of driven transistors, based on the duty correction value CTR_CR, and may output the corrected duty ratio.

As described above, the correction value generation circuit 200, including the input circuit 210, the charging circuit 220, the detection circuit 230, and the processing circuit 240, may generate the duty correction value CTR_CR through a charging operation and a counting operation based on aligned measurement data.

The initialization circuit 250 may be an element for generating the start signal CTR_S having a pulse form based on the initialization signal CTR_INT. In this case, the initialization signal CTR_INT may be a signal that shifts from a logic "low" to a logic "high" upon duty measurement operation.

More specifically, the initialization circuit 250 may include a delay circuit D for inverting and delaying the initialization signal CTR_INT as much as a preset time and outputting the inverted and delayed signal and a NOR gate NOR for receiving the initialization signal CTR_INT and the output signal of the delay circuit D and outputting the start signal CTR_S.

Accordingly, the delay circuit D may receive the initialization signal CTR_INT, may invert and delay the initialization signal CTR_INT, and may output the inverted and delayed signal. Furthermore, the NOR gate NOR may generate the start signal CTR_S having a logic-high pulse width by performing a NOR operation on the initialization signal CTR_INT and the output signal of the delay circuit D. In this case, the pulse width of the start signal CTR_S may correspond to the amount of delay reflected in the delay circuit D. The start signal CTR_S has already been described above in the contents for the detection circuit 230, but may control the turn-on operation of the second PMOS transistor PM2.

Accordingly, through the aforementioned configuration, the initialization circuit 250 may generate the start signal CTR_S having a pulse width based on the initialization signal CTR_INT. Furthermore, as described above, the detection circuit 230 may control shifting time corresponding to enable time of the enable signal CTR_EN when a duty measurement operation is entered, based on the start signal CTR_S.

Figure 3:
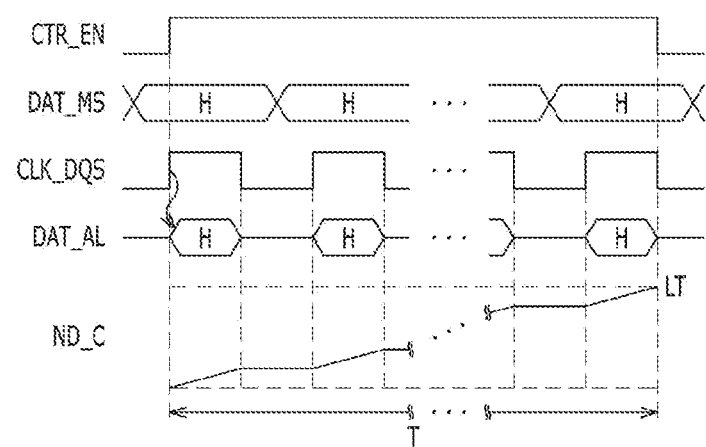
FIG. 3 is a timing diagram illustrating some operations of a duty cycle correction circuit illustrated in FIG. 1.

FIG. 3 is a timing diagram for illustrating some operations of the duty cycle correction circuit illustrated in FIG. 1. FIG. 3 illustrates signal waveforms of the enable signal CTR_EN, the unit pattern data DAT_MS, the strobe clock signal CLK_DQS, the aligned data DAT_AL, and the charging node ND_C.

A duty measurement operation of the duty cycle correction circuit according to an embodiment is described below with reference to FIGS. 1 to 3.

Prior to a description, the data generation circuit 400 may generate the unit pattern data DAT_MS used upon duty measurement operation. In this case, the unit pattern data DAT_MS may be data in which a logic "high" and a logic "low" have been combined. In this case, measurement data may mean data that is synchronized with the strobe clock signal CLK_DQS and that is necessary for a charging operation and a counting operation.

In this case, there is given an example in which a level of the measurement data is a logic "high" (H), Accordingly, the level of the measurement data becomes a logic "high" (H). The data generation circuit 400 of FIG. 1 may continuously generate the unit pattern data DAT_MS into which measurement data having the logic "high" (H) has been inserted.

First, the enable signal CTR_EN may shift from a logic "low" to a logic "high" based on the initialization signal CTR_INT in FIG. 2, Time at which the enable signal CTR_EN shifts from a logic "low" to a logic "high" may be time of entering a duty measurement operation.

The data alignment circuit 100 of FIG. 1 may continuously receive the unit pattern data DAT_MS generated by the data generation circuit 400, and may generate the aligned data DAT_AL based on the strobe clock signal CLK_DQS. Accordingly, the aligned data DAT_AL may have the same logic "high" (H) as measurement data. At this time, if the logic "high" section of the strobe clock signal CLK_DQS is small, the logic "high" section of the aligned data DAT_AL may become small. In contrast, if the logic "high" section of the strobe clock signal CLK_DQS is large, the logic "high" section of the aligned data DAT_AL may become large.

The aligned data DAT_AL input to the correction value generation circuit 200 of FIG. 1 become the charging data DAT_C, that is, the output signal of the second inverter INV2 of FIG. 2. Although not illustrated in FIG. 3, the charging data DAT_C may be a signal having a logic level opposite to the logic level of the aligned data DAT_AL.

Accordingly, the first PMOS transistor PM1 of FIG. 2 may be turned on based on the logic "low" of the charging data DAT_C. For this reason, the first PMOS transistor PM1 may transmit, to the charging capacitor C, charges for charging corresponding to the charging data DAT_C. Furthermore, the charging capacitor C may gradually raise a voltage level of the charging node ND_C by storing the charges for charging.

Thereafter, when the voltage level of the charging node ND_C reaches a threshold voltage LT of the fourth inverter INV4, the enable signal CTR_EN may shift from a logic "high" to a logic "low" and may be disabled. In this case, the section in which the voltage level of the charging node ND_C rises from the state, in which the voltage level of the charging node ND_C has been initialized, to the threshold voltage LT of the fourth inverter INV4 may be defined as "T."

The counting circuit 241 of the processing circuit 240 of FIG. 2 may perform a counting operation based on the charging data DAT_C during the section T upon duty measurement operation. At this time, when the voltage level of the charging node ND_C reaches the threshold voltage LT of the fourth inverter INV4, the enable signal CTR_EN may shift from a logic "high" to a logic "low." Accordingly, the NAND gate NAND of the input circuit 210 of FIG. 2 might not output the aligned data DAT_AL to the first inverter INV1 based on the enable signal CTR_EN, although the aligned data DAT_AL is input to the NAND gate NAND of the input circuit 210. The counting circuit 241 to which the charging data DAT_C corresponding to the aligned data DAT_AL are input may no longer perform the counting operation.

Additionally, the counting circuit 241 may use the charging data DAT_C as a counting clock. In this case, the charging data DAT_C may correspond to the aligned data DAT_AL illustrated in FIG. 3. As described above, the logic "high" section of the aligned data DAT_AL may become small or large depending on a duty ratio of the strobe clock signal CLK_DQS. That is, the logic "high" section of the aligned data DAT_AL used as the counting clock of the counting circuit 241 may become very small. Accordingly, although not illustrated in the drawing, a circuit element for adjusting the pulse width of the aligned data DAT_AL, that is, a counting dock, to a pulse width capable of a counting operation may be added to the counting circuit 241.

It is assumed that upon duty measurement operation, the number of measurement counting values CNT<0:12> counted by the counting circuit 241 is 822, for convenience of a description. Furthermore, it is assumed that the number of reference counting values REF<0:12> set by the setting circuit 242 based on the threshold voltage information INF_TH is 776.

In this case, the comparison circuit 243 may compare the 822 measurement counting values CNT<0:12> with the 776 reference counting values REF<0:12>, and may generate the duty correction value CTR_CR based on a result of the comparison. In this case, the 822 measurement counting values CNT<0:12> are larger than the 776 reference counting values REF<0:12>. The result of the comparison may mean that a current duty ratio of the logic "high" section of the strobe clock signal CLK_DQS is smaller than a normal duty ratio of the logic "high" section, that is, 50:50, by a difference between the 822 measurement counting values CNT<0:12> and the 776 reference counting values REF<0:12>. In contrast, if the number of measurement counting values CNT<0:12> is smaller than the number of reference counting values REF<0:12>, a result of a comparison may mean that that a current duty ratio of the logic "high" section of the strobe clock signal CLK_DQS is larger than a normal duty ratio of the logic "high" section, that is, 50:50, by a difference between the measurement counting values CNT<0:12> and the reference counting values REF<0:12>.

Accordingly, the clock generation circuit 300 of FIG. 1 may correct the duty ratio of the strobe clock signal CLK_DQS to 50:50 by increasing or decreasing the logic "high" section of the strobe clock signal CLK_DQS based on the duty correction value CTR_CR. In this case, there is given an example in which the number of measurement counting values CNT<0:12> is 822 larger than 776, that is, the number of reference counting values REF<0:12>. Accordingly, the clock generation circuit 300 may correct the duty ratio of the strobe clock signal CLK_DQS by increasing the logic "high" section of the strobe clock signal CLK_DQS by as much as a result of the comparison based on the duty correction value CTR_CR.

The duty cycle correction circuit according to an embodiment may generate the unit pattern data DAT_MS into which the measurement data have been inserted. The duty cycle correction circuit may align the unit pattern data DAT_MS in the strobe clock signal CLK_DQS and then perform a charging operation and a counting operation based on the aligned measurement data. The duty cycle correction circuit may generate the duty correction value CTR_CR through the charging operation and the counting operation. As a result, the duty cycle correction circuit can correct the duty ratio of the strobe clock signal CLK_DQS to 50:50 based on the duty correction value CTR_CR. Furthermore, the corrected strobe clock signal CLK_DQS can improve reliability of data synchronized with the corrected strobe dock signal CLK_DQS.

Furthermore, the duty cycle correction circuit according to an embodiment may use the aligned data DAT_AL as a counting clock when performing a counting operation. For this reason, the duty cycle correction circuit might not require a separate counting clock for the counting operation. Accordingly, in general, the duty cycle correction circuit might not require a clock generation circuit necessary upon counting operation. Accordingly, the duty cycle correction circuit can have a size reduced by as much as an area corresponding to the clock generation circuit.

Figure 4:
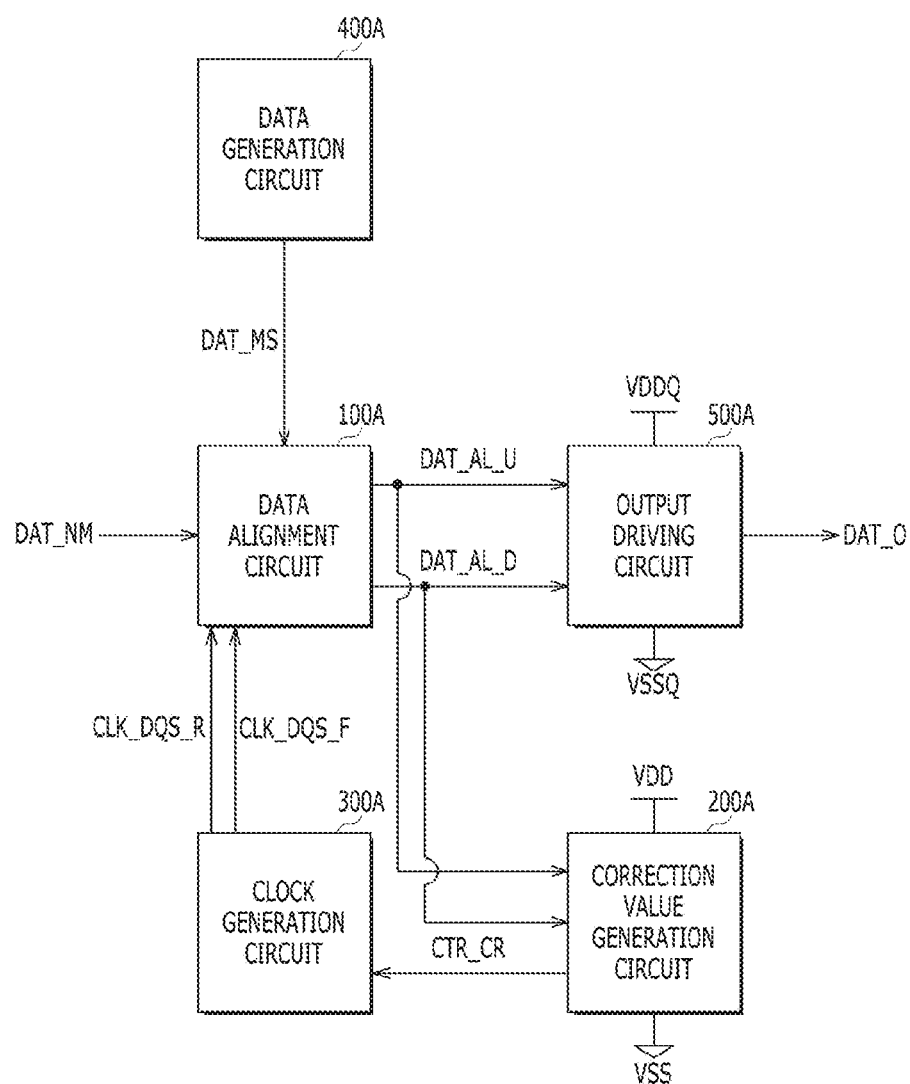
FIG. 4 is a block diagram illustrating a configuration of a semiconductor device according to an embodiment.

FIG. 4 is a block diagram for illustrating a configuration of a semiconductor device according to an embodiment.

Referring to FIG. 4, a duty cycle correction circuit may include a data alignment circuit 100A, a correction value generation circuit 200A, and a clock generation circuit 300A. The duty cycle correction circuit may further include a data generation circuit 400A and an output driving circuit 500A.

Prior to a description, the embodiment of FIG. 1 has been described by taking an example in which the strobe clock signal CLK_DQS is used. In contrast, the embodiment of FIG. 4 is described by taking an example in which a first strobe clock signal CLK_DQS_R corresponding to the rising edge of a strobe clock signal CLK_DQS and a second strobe clock signal CLK_DQS_F corresponding to the falling edge of the strobe clock signal CLK_DQS are used.

First, the data alignment circuit 100A may be an element for receiving unit pattern data DAT_MS into which at least one measurement data has been inserted and aligning the unit pattern data DAT_MS based on the first strobe clock signal CLK_DQS_R and second strobe clock signal CLK_DQS_F, respectively. In this case, the first strobe clock signal CLK_DQS_R may be a signal corresponding to the rising edge of the strobe clock signal CLK_DQS. The second strobe clock signal CLK_DQS_F may be a signal corresponding to the falling edge of the strobe clock signal CLK_DQS.

The data alignment circuit 100A may be used for both a normal operation and a duty measurement operation. In other words, upon normal operation, the data alignment circuit 100A may receive normal data DAT_NM, and may align the normal data DAT_NM based on the first and second strobe clock signals CLK_DQS_R and CLK_DQS_F, respectively. Furthermore, upon duty measurement operation, the data alignment circuit 100A may receive the unit pattern data DAT_MS, and may align the unit pattern data DAT_MS based on the first and second strobe clock signals CLK_DQS_R and CLK_DQS_F, respectively.

Next, the data alignment circuit 100A may output up-driving data DAT_AL_U and down-driving data DAT_AL_D obtained by aligning the unit pattern data DAT_MS based on the first and second strobe clock signals CLK_DQS_R and CLK_DQS_F, respectively.

In this case, the up-driving data DAT_AL_U may be the unit pattern data DAT_MS aligned based on the first and second strobe clock signals CLK_DQS_R and CLK_DQS_F. Furthermore, the down-driving data DAT_AL_D may be data having a logic level opposite to a logic level of the up-driving data DAT_AL_U. Accordingly, the up-driving data DAT_AL_U may be defined as data aligned by the first strobe clock signal CLK_DQS_R. The down-driving data DAT_AL_D may be defined as data aligned by the second strobe clock signal CLK_DQS_F.

The correction value generation circuit 200A may be an element for generating a duty correction value CTR_CR through a charging operation and a counting operation, based on measurement data inserted into the up-driving data DAT_AL_U and the down-driving data DAT_AL_D, respectively. A detailed configuration and operation of the correction value generation circuit 200A is more specifically described with reference to FIG. 5 below.

The clock generation circuit 300A may be an element for generating the first and second strobe clock signals CLK_DQS_R and CLK_DQS_F. Furthermore, the clock generation circuit 300A may correct the duty ratios of the first and second strobe clock signals CLK_DQS_R and CLK_DQS_F based on the duty correction value CTR_CR generated by the correction value generation circuit 200A.

The first and second strobe clock signals CLK_DQS_R and CLK_DQS_F having their duty ratios corrected based on the duty correction value CTR_CR may be input to the data alignment circuit 100A. Accordingly, the data alignment circuit 100A may align the normal data DAT_MN, input upon normal operation, based on the first and second strobe clock signals CLK_DQS_R and CLK_DQS_F having their duty ratios corrected to 50:50.

Additionally, upon duty measurement operation, the data generation circuit 400A may be an element for continuously generating the unit pattern data DAT_MS corresponding to the first and second strobe clock signals CLK_DQS_R and CLK_DQS_F, respectively.

At least one measurement data corresponding to the first strobe clock signal CLK_DQS_R may be inserted into the unit pattern data DAT_MS generated by the data generation circuit 400A. Consecutively, at least one measurement data corresponding to the second strobe clock signal CLK_DQS_F may be inserted into the unit pattern data DAT_MS. The measurement data corresponding to the first and strobe clock signals CLK_DQS_R and CLK_DQS_F, respectively, is described later.

The output driving circuit 500A may be an element for receiving the up-driving data DAT_AL_U and the down-driving data DAT_AL_D output by the data alignment circuit 100A and driving the up-driving data DAT_AL_U and the down-driving data DAT_AL_D in a preset voltage level. In this case, the output driving circuit 500A may generate final data DAT_O that swings at a first supply power voltage VDDQ and a first ground power voltage VSSQ through a pre-driving operation and a main driving operation based on the up-driving data DAT_AL_U and the down-driving data DAT_AL_D.

Figure 5:
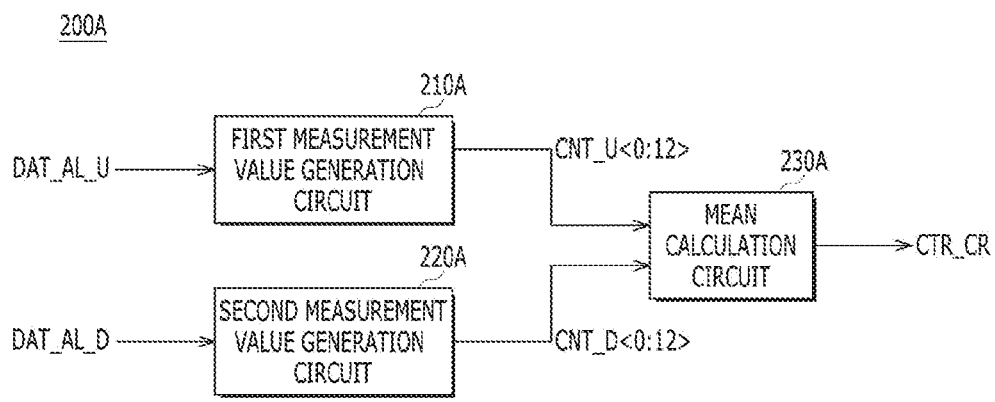
FIG. 5 is a block diagram illustrating a configuration of a correction value generation circuit illustrated in FIG. 4.

FIG. 5 is a block diagram for illustrating a configuration of the correction value generation circuit 200A illustrated in FIG. 4.

Referring to FIG. 5, the correction value generation circuit 200A may include a first measurement value generation circuit 210A, a second measurement value generation circuit 220A, and a mean calculation circuit 230A.

First, the first measurement value generation circuit 210A may be an element for generating first measurement counting values CNT_U<0:12> based on the up-driving data DAT_AL_U. Furthermore, the second measurement value generation circuit 220A may be an element for generating second measurement counting values CNT_D<0:12> based on the down-driving data DAT_AL_D.

As already described above, the up-driving data DAT_AL_U may be data obtained by aligning the unit pattern data DAT_MS based on the first strobe clock signal CLK_DQS_R. The down-driving data DAT_AL_D may be data obtained by aligning the unit pattern data DAT_MS based on the second strobe clock signal CLK_DQS_F. Furthermore, measurement data for the duty measurement operation on the first strobe clock signal CLK_DQS_R may be inserted into the up-driving data DAT_AL_U. Measurement data for the duty measurement operation of the second strobe clock signal CLK_DQS_F may be inserted into the down-driving data DAT_AL_D.

Accordingly, the first measurement value generation circuit 210A may perform a measurement operation on the duty ratio of the first strobe clock signal CLK_DQS_R based on the up-driving data DAT_AL_U. Furthermore, the second measurement value generation circuit 220A may perform a measurement operation on the duty ratio of the second strobe clock signal CLK_DQS_F based on the down-driving data DAT_AL_D. Detailed configurations and operations of the first and second measurement value generation circuits 410A and 420A are described in more detail with reference to FIG. 6.

The mean calculation circuit 230A may be an element for analyzing the mean value of the first measurement counting values CNT_U<0:12> and the second measurement counting values CNT_D<0:12> and generating the duty correction value CTR_CR. In this case, there is given an example in which each of the first and second measurement counting values CNT_U<0:12> and CNT_D<0:12> is configured with 13 bits.

It may be assumed that the number of first measurement counting values CNT_U<0:12> is 800 and the number of second measurement counting values CNT_D<0:12> is 752, for convenience of a description. The mean calculation circuit 230A may obtain 776, that is, the mean value of the first measurement counting values CNT_U<0:12> and the second measurement counting values CNT_D<0:12>. Furthermore, the mean calculation circuit 230A may output the duty correction value CTR_CR, including a difference between 776, that is, the mean value, and 800, that is, the number of first measurement counting values CNT_U<0:12>. Furthermore, the mean calculation circuit 230A may output the duty correction value CTR_CR, including a difference between 776, that is, the mean value, and 752, that is, the number of second measurement counting values CNT_D<0:12>.

In this case, the duty correction value CTR_CR might be information generated based on only the first measurement counting values CNT_U<0:12> and the second measurement counting values CNT_D<0:12>. In other words, the duty correction value CTR_CR may be a result value of a comparison between the first measurement counting values CNT_U<0:12> corresponding to the first strobe clock signal CLK_DQS_R and the second measurement counting values CNT_D<0:12> corresponding to the second strobe clock signal CLK_DQS_F. Accordingly, the duty correction value CTR_CR may be a result value of a comparison between the duty ratio of the first strobe clock signal CLK_DQS_R and the duty ratio of the second strobe clock signal CLK_DQS_F. That is, the duty correction value CTR_CR may correspond to the final value calculated through a complementary comparison between the first strobe clock signal CLK_DQS_R and the second strobe clock signal CLK_DQS_F.

The duty correction value CTR_CR generated as described above may be provided to the clock generation circuit 300A of FIG. 4. Accordingly, the clock generation circuit 300A may correct the duty ratios of the first strobe clock signal CLK_DQS_R and the second strobe clock signal CLK_DQS_F based on the duty correction value CTR_CR.

As a result, the first strobe clock signal CLK_DQS_R and the second strobe clock signal CLK_DQS_F may have logic "high" sections which may be counted as 776 during a duty measurement operation section. That is, the duty ratios of the first strobe clock signal CLK_DQS_R and the second strobe dock signal CLK_DQS_F may become the same.

The duty cycle correction circuit according to an embodiment can correct the duty ratios of the first and second strobe dock signals CLK_DQS_R and CLK_DQS_F by complementarily comparing and analyzing the first strobe clock signal CLK_DQS_R and the second strobe clock signal CLK_DQS_F.

Furthermore, the duty cycle correction circuit according to an embodiment can minimize a clock strain factor between the first strobe clock signal CLK_DQS_R and the second strobe clock signal CLK_DQS_F through a complementary correction operation. In this case, the minimized clock strain factor between the first strobe clock signal CLK_DQS_R and the second strobe clock signal CLK_DQS_F may mean that the first strobe clock signal CLK_DQS_R and the second strobe clock signal CLK_DQS_F have the same waveform. If the first strobe clock signal CLK_DQS_R and the second strobe clock signal CLK_DQS_F have the same waveform, upon normal operation, data aligned based on the first strobe clock signal CLK_DQS_R and data aligned based on the second strobe clock signal CLK_DQS_F might not overlap. In this case, if the data do not overlap, this may mean that a loss rate between the data can be minimized.

Figure 6:
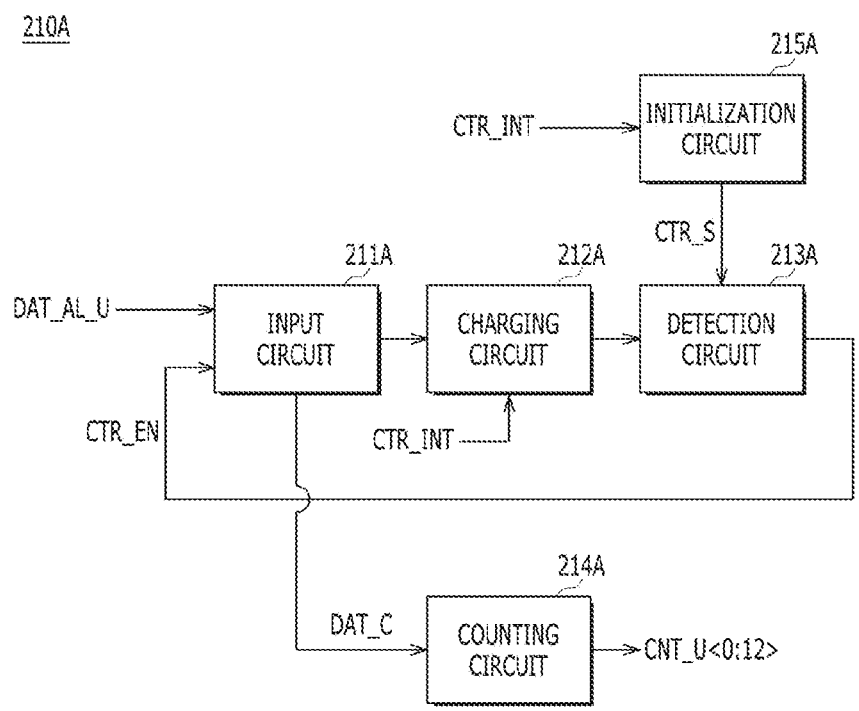
FIG. 6 is a block diagram illustrating a configuration of a first measurement value generation circuit illustrated in FIG. 5.

FIG. 6 is a block diagram for illustrating a configuration of the first measurement value generation circuit 210A illustrated in FIG. 5. The first measurement value generation circuit 210A and the second measurement value generation circuit 220A of FIG. 5 may have different driving data input thereto, respectively, and different counting values output therefrom, respectively, and may have similar internal elements. Accordingly, a description of the second measurement value generation circuit 220A may be omitted based on a description of the first measurement value generation circuit 210A of FIG. 6.

Referring to FIG. 6, the first measurement value generation circuit 210A may include an input circuit 211A, a charging circuit 212A, a detection circuit 213A, and a counting circuit 214A. The first measurement value generation circuit 210A may further include an initialization circuit 215A. In this case, the elements of the first measurement value generation circuit 210A may be similar to the elements of the correction value generation circuit 200 of FIG. 2, respectively.

More specifically, the input circuit 211A of FIG. 6 may be an element for receiving the up-driving data in the enable section of an enable signal CTR_EN. The input circuit 211A of FIG. 6 may have a configuration corresponding to the input circuit 210 of FIG. 2.

The charging circuit 212A may be an element for storing charges for charging corresponding to the up-driving data DAT_AL_U output by the input circuit 211A. The charging circuit 212A may be initialized based on an initialization signal CTR_INT. The charging circuit 212A of FIG. 6 may have a configuration corresponding to the charging circuit 220 of FIG. 2.

The detection circuit 213A may be an element for detecting time at which charges for charging stored in the charging circuit 212A are stored by a preset value and controlling the enable signal CTR_EN. The enable signal CTR_EN may be initialized based on the initialization signal CTR_INT. The detection circuit 213A of FIG. 6 may have a configuration corresponding to the detection circuit 230 of FIG. 2.

The counting circuit 214A may be an element for generating the first measurement counting values CNT_U<0:12> through a counting operation based on charging data DAT_C corresponding to the up-driving data DAT_AL_U. The counting circuit 214A of FIG. 6 may have a configuration corresponding to the counting circuit 241 of FIG. 2.

The initialization circuit 215A may be an element for generating a start signal CTR_S having a pulse form based on the initialization signal CTR_INT. The initialization circuit 215A of FIG. 6 may have an element corresponding to the initialization circuit 250 of FIG. 2.

Through the aforementioned configuration, the first measurement value generation circuit 210A may perform a charging operation and a counting operation based on the aligned measurement data corresponding to the up-driving data DAT_AL_U. Furthermore, the first measurement value generation circuit 210A may generate the first measurement counting values CNT_U<0:12> corresponding to the duty ratio of the first strobe clock signal CLK_DQS_R through a charging operation and a counting operation.

Likewise, although not illustrated in the drawing, the second measurement value generation circuit 220A may perform a charging operation and a counting operation based on the aligned measurement data corresponding to the down-driving data DAT_AL_D through a configuration similar to the first measurement value generation circuit 210A. Furthermore, the second measurement value generation circuit 220A may generate the second measurement counting values CNT_D<0:12> corresponding to the duty ratio of the second strobe clock signal CLK_DQS_F through a charging operation and a counting operation.

Figure 7:
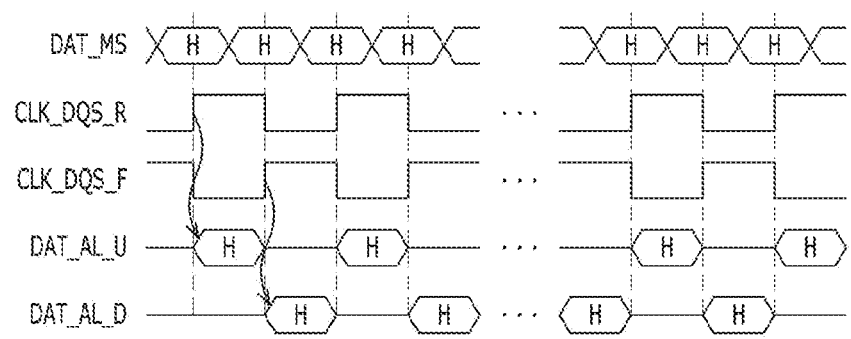
FIG. 7 is a timing diagram illustrating operation of a duty cycle correction circuit illustrated in FIG. 4.

FIG. 7 is a timing diagram for illustrating some operations of the duty cycle correction circuit illustrated in FIG. 4. FIG. 7 illustrates signal waveforms of the unit pattern data DAT_MS, the first strobe clock signal CLK_DQS_R, the second strobe clock signal CLK_DQS_F, the up-driving data DAT_AL_U, and the down-driving data DAT_AL_D.

Referring to FIGS. 4 to 7, the duty cycle correction circuit may generate, as the up-driving data DAT_AL_U, measurement data inserted into the unit pattern data DAT_MS for a duty measurement operation on the first strobe clock signal CLK_DQS_R. Furthermore, the duty cycle correction circuit may generate, as the down-driving data DAT_AL_D, measurement data inserted into the unit pattern data DAT_MS for a duty measurement operation on the second strobe clock signal CLK_DQS_F.

In this case, measurement data having a logic "high" (H) and corresponding to the first strobe clock signal CLK_DQS_may be inserted into the unit pattern data DAT_MSR. Measurement data having a logic "high" (H) and corresponding to the second strobe clock signal CLK_DQS_F may be inserted into the unit pattern data DAT_MS. Accordingly, the up-driving data DAT_AL_U and the down-driving data DAT_AL_D may have results into which the measurement data have been reflected.

As illustrated in FIG. 5, the correction value generation circuit 200A of FIG. 4 may include the first measurement value generation circuit 210A for performing a charging operation and a counting operation based on the measurement data of the up-driving data DAT_AL_U, and may include the second measurement value generation circuit 220A for performing a charging operation and a counting operation based on the measurement data of the down-driving data DAT_AL_D.

Furthermore, the mean calculation circuit 230A may output the duty correction value CTR_CR by analyzing the mean value of the first measurement counting values CNT_U<0:12> generated by the first measurement value generation circuit 210A and the second measurement counting values CNT_D<0:12> generated by the second measurement value generation circuit 220A. In this case, the duty correction value CTR_CR may include a result value of a complementary comparison between the first strobe clock signal CLK_DQS_R and the second strobe clock signal CLK_DQS_F.

The duty cycle correction circuit according to an embodiment includes the first measurement value generation circuit 210A and the second measurement value generation circuit 220A and thus can complementarily compare and analyze the first and second strobe clock signals CLK_DQS_R and CLK_DQS_F. Furthermore, the duty cycle correction circuit can minimize a clock strain factor between the first strobe clock signal CLK_DQS_R and the second strobe clock signal CLK_DQS_F through complementary comparison and analysis.

Figure 8:
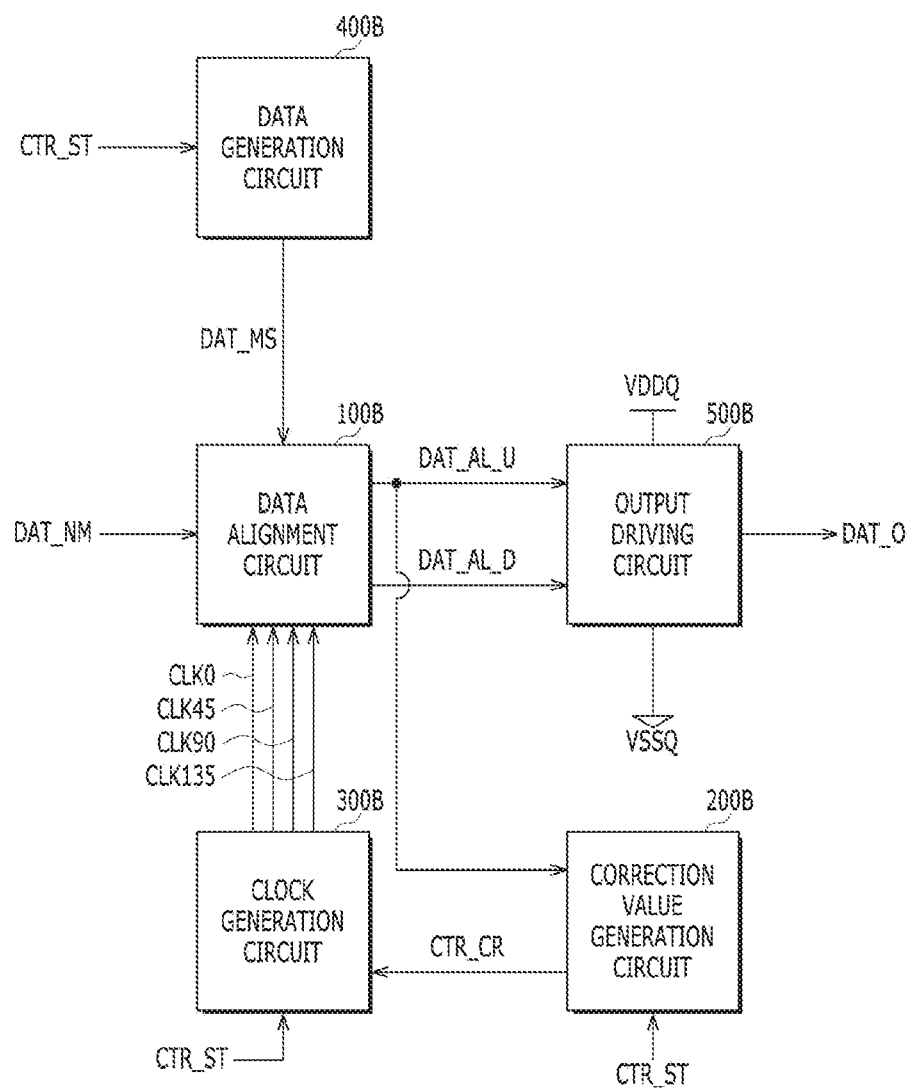
FIG. 8 is a block diagram illustrating a configuration of a semiconductor device according to an embodiment.

FIG. 8 is a block diagram for illustrating a configuration of a semiconductor device according to an embodiment.

Referring to FIG. 8, a duty cycle correction circuit may include a data alignment circuit 100B, a correction value generation circuit 200B, and a clock generation circuit 300B. The duty cycle correction circuit may further include a data generation circuit 400B and an output driving circuit 500B.

Prior to a description, the embodiment of FIG. 4 has been described by taking an example in which the first strobe clock signal CLK_DQS_R and the second strobe clock signal CLK_DQS_F are used. In contrast, the embodiment of FIG. 8 is described by taking an example in which four first to fourth strobe clock signals CLK0, CLK45, CLK90, and CLK135 having different phases are used. In this case, the first to fourth strobe clock signals CLK0, CLK45, CLK90, and CLK135 may be clock signals each having a phase difference of 45°. Furthermore, the first to fourth strobe clock signals CLK0, CLK45, CLK90, and CLK135 may be clock signals that are sequentially enabled for a burst length operation.

First, the data alignment circuit 100B may be an element for receiving unit pattern data DAT_MS into which at least one measurement data has been inserted and aligning the unit pattern data DAT_MS based on a corresponding strobe clock signal of the first to fourth strobe clock signals CLK0, CLK45, CLK90, and CLK135.

Upon normal operation, the data alignment circuit 100B may receive normal data DAT_NM and align the normal data DAT_NM based on the first to fourth strobe clock signals CLK0, CLK45, CLK90, and CLK135, respectively. Furthermore, upon duty measurement operation, the data alignment circuit 100B may receive the unit is pattern data DAT_MS selectively output by the data generation circuit 4003, and may align the received unit pattern data DAT_MS based on a corresponding strobe clock signal selectively output by the clock generation circuit 300B. In this case, a selection control signal CTR_ST is more specifically described below. Furthermore, the unit pattern data DAT_MS selectively output by the selection control signal CTR_ST and a corresponding strobe clock signal are more specifically described below.

Accordingly, upon duty measurement operation, the data alignment circuit 100B may output up-driving data DAT_AL_U, obtained by aligning the unit pattern data DAT_MS based on a corresponding strobe clock signal. In this case, down-driving data DAT_AL_D may be data having a logic level opposite a logic level of the up-driving data DAT_AL_U for a pre-driving operation and main driving operation of the output driving circuit 500B positioned at the rear end of the duty cycle correction circuit.

The correction value generation circuit 200B may be an element for generating a duty correction value CTR_CR through a charging operation and a counting operation based on the aligned measurement data corresponding to the up-driving data DAT_AL_U. A detailed configuration and operation of the correction value generation circuit 200B is described in more detail with reference to FIG. 9.

The clock generation circuit 300B may be an element for generating the first to fourth strobe clock signals CLK0, CLK45, CLK90, and CLK135. Furthermore, the clock generation circuit 300B may correct the duty ratios of the first to fourth strobe clock signals CLK0, CLK45, CLK90, and CLK135 based on the duty correction value CTR_CR generated by the correction value generation circuit 200B.

In this case, upon duty measurement operation, the clock generation circuit 300B may selectively generate a corresponding strobe clock signal of the first to fourth strobe clock signals CLK0, CLK45, CLK90, and CLK135 based on the selection control signal CTR_ST. Accordingly, upon duty measurement operation, the clock generation circuit 300B can minimize an electric current consumed to generate a strobe clock signal.

Additionally, the data generation circuit 400B may be an element for continuously generating the unit pattern data DAT_MS corresponding to the first to fourth strobe clock signals CLK0, CLK45, CLK90, and CLK135, respectively, upon duty measurement operation.

The data generation circuit 400B may selectively output any one of the unit pattern data DAT_MS corresponding to the first to fourth strobe clock signals CLK0, CLK45, CLK90, and CLK135, respectively, based on the selection control signal CTR_ST corresponding to a selection mode.

In this case, the selection mode may mean an operation mode for selecting any one of the first to fourth strobe clock signals CLK0, CLK45, CLK90, and CLK135. Accordingly, the selection control signal CTR_ST corresponding to the selection mode may be a signal to control the duty measurement operation on each of the first to fourth strobe clock signals CLK0, CLK45, CLK90, and CLK135. In other words, in an embodiment, a duty measurement operation may be performed on each of the first to fourth strobe clock signals CLK0, CLK45, CLK90, and CLK135 based on the selection control signal CTR_ST. In this case, the selection control signal CTR_ST may be a signal to control an overall selection operation of a circuit for a corresponding strobe clock signal on which a duty measurement operation is performed.

At least one measurement data corresponding to each of the first to fourth strobe clock signals CLK0, CLK45, CLK90, and CLK135 have been inserted into the unit pattern data DAT_MS generated by the data generation circuit 400B. The unit pattern data DAT_MS is described later.

The output driving circuit 500B may be an element for receiving the up-driving data DAT_AL_U and the down-driving data DAT_AL_D output by the data alignment circuit 100B and generating final data DAT_O through a pre-driving operation and a main driving operation.

Upon duty measurement operation, the duty cycle correction circuit according to an embodiment might generate only a corresponding strobe clock signal of the first to fourth strobe clock signals CLK0, CLK45, CLK90, and CLK135 based on the selection mode. Furthermore, the duty cycle correction circuit according to an embodiment can minimize an electric current consumed upon duty measurement operation because it performs a charging operation and a counting operation based on the corresponding strobe clock signal.

Figure 9:
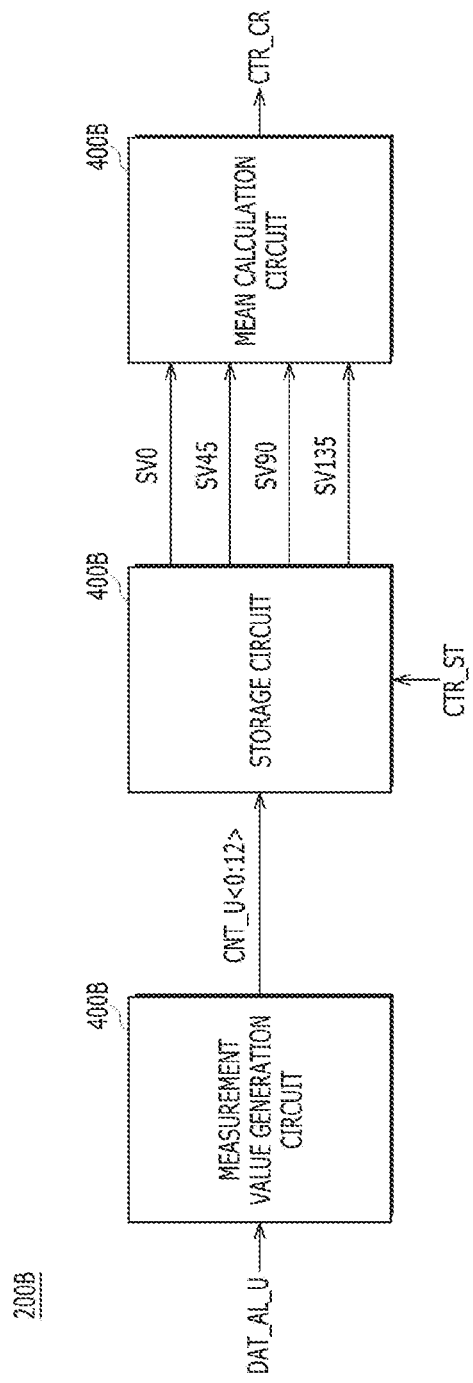
FIG. 9 is a diagram illustrating a configuration of a correction value generation circuit illustrated in FIG. 8.

FIG. 9 is a diagram for illustrating a configuration of the correction value generation circuit 200B illustrated in FIG. 8.

Referring to FIG. 9, the correction value generation circuit 200B may include a measurement value generation circuit 210B, a storage circuit 220B, and a mean calculation circuit 230B.

First, the measurement value generation circuit 210B may be an element for generating measurement counting values CNT_U<0:12> based on the up-driving data DAT_AL_U.

As already described above, the up-driving data DAT_AL_U may be data aligned based on any one of the first to fourth strobe dock signals CLK0, CLK45, CLK90, and CLK135 generated based on the selection mode. Accordingly, the measurement value generation circuit 210B may generate the measurement counting values CNT_U<0:12> for the duty ratio of each of the first to fourth strobe clock signals CLK0, CLK45, CLK90, and CLK135 based on the selection mode.

In this case, since the measurement value generation circuit 210B of FIG. 9 has elements corresponding to those of the first measurement value generation circuit 210A of FIG. 6, a detailed to description thereof may be omitted.

As described with reference to the first measurement value generation circuit 210A of FIG. 6, the measurement value generation circuit 210B of FIG. 9 may also internally generate an enable signal CTR_EN. In this case, the enable signal CTR_EN may be a signal to control the selection control signal CTR_ST.

More specifically, when a charging operation and a counting operation for measuring the duty ratio of a corresponding strobe clock signal are completed, the enable signal CTR_EN may shift from a logic "high" to a logic "low," as illustrated in FIG. 3. Accordingly, the selection control signal CTR_ST may be controlled in the state in which a next strobe clock signal is selected in the corresponding strobe clock signal based on the enable signal CTR_EN. That is, the selection control signal CTR_ST may be controlled based on the enable signal CTR_EN.

For example, it may be assumed that upon duty measurement operation, the duty cycle correction circuit performs a charging operation and a counting operation based on the first strobe dock signal CLK0 of the first to fourth strobe clock signals CLK0, CLK45, CLK90, and CLK135. In this case, when the charging operation and the counting operation on the first strobe clock signal CLK0 are completed, the selection control signal CTR_ST may be controlled to select a next strobe clock signal, for example, the second strobe clock signal CLK45 in the first strobe clock signal CLK0, that is, the corresponding strobe clock signal. Accordingly, the duty cycle correction circuit may perform a charging operation and a counting operation on the second strobe clock signal CLK45 after the first strobe clock signal CLK0.

The storage circuit 220B may be an element for storing measurement counting values CNT<0:12> corresponding to each of the first to fourth strobe clock signals CLK0, CLK45, CLK90, and CLK135 based on the selection control signal CTR_ST.

Although not illustrated in the drawing, the storage circuit 220B may be configured with four storage circuits for storing the measurement counting values CNT<0:12> corresponding to each of the first to fourth strobe clock signals CLK0, CLK45, CLK90, and CLK135. Accordingly, the storage circuit 220B may output first to fourth saved values SV0, SV45, SV90, and SV135 including the measurement counting values CNT<0:12> of the first to fourth strobe clock signals CLK0, CLK45, CLK90, and CLK135, respectively.

The mean calculation circuit 230B may be an element for receiving the first to fourth saved values SV0, SV45, SV90, and SV135 from the storage circuit 220B and generating the duty correction value CTR_CR by analyzing the mean value of the first to fourth saved values SV0, SV45, SV90, and SV135.

For convenience of a description, it may be assumed that the number of first saved values SV0 corresponding to the first strobe clock signal CLK0 is 828, the number of second saved values SV45 corresponding to the second strobe clock signal CLK45 is 673, the number of third saved values SV90 corresponding to the third strobe clock signal CLK90 is 781, and the number of fourth saved values SV135 corresponding to the fourth strobe clock signal CLK135 is 822. The mean calculation circuit 230B may obtain 776, that is, the mean value of the first to fourth saved values SV0, SV45, SV90, and SV135. Furthermore, the mean calculation circuit 230B may output the duty correction value CTR_CR, including a difference between 776, that is, the mean value, and each of 828, 673, 781, and 822, that is, the numbers of the first to fourth saved values SV0, SV45, SV90, and SV135 of the first to fourth strobe clock signals CLK0, CLK45, CLK90, and CLK135, respectively.

In this case, the duty correction value CTR_CR may correspond to the final value calculated through complementary comparisons between the first to fourth strobe clock signals CLK0, CLK45, CLK90, and CLK135. Furthermore, the duty correction value CTR_CR may be input to the clock generation circuit 300B of FIG. 8. Accordingly, the clock generation circuit 300B may correct the duty ratio of each of the first to fourth strobe clock signals CLK0, CLK45, CLK90, and CLK135 based on the duty correction value CTR_CR.

As a result, the first to fourth strobe clock signals CLK0, CLK45, CLK90, and CLK135 have different phases, but may have the same logic "high" section. That is, the duty ratios of the first to fourth strobe clock signals CLK0, CLK45, CLK90, and CLK135 may become identical.

The duty cycle correction circuit according to an embodiment can correct the duty ratio of each of the first to fourth strobe clock signals CLK0, CLK45, CLK90, and CLK135 by performing a duty measurement operation on each of the first to fourth strobe clock signals CLK0, CLK45, CLK90, and CLK135 based on the selection mode. Furthermore, the duty cycle correction circuit according to an embodiment can minimize a clock strain factor between the first to fourth strobe clock signals CLK0, CLK45, CLK90, and CLK135 by complementarily comparing and analyzing the first to fourth strobe clock signals CLK0, CLK45, CLK90, and CLK135.

Figure 10:
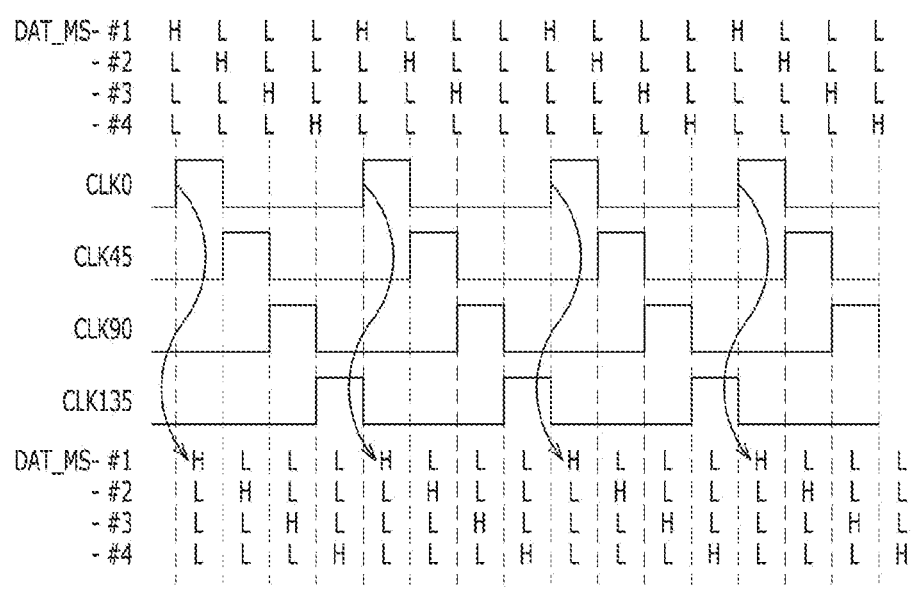
FIG. 10 is a timing diagram illustrating operation of a duty cycle correction circuit illustrated in FIG. 8.

FIG. 10 is a timing diagram for illustrating some operations of the duty cycle correction circuit illustrated in FIG. 8. FIG. 10 illustrates signal waveforms of the unit pattern data DAT_MS generated based on selection modes #1, #2, #3, and #4, the first to fourth strobe clock signals CLK0, CLK45, CLK90, and CLK135, and the up-driving data DAT_AL_U aligned based on the selection modes #1, #2, #3, and #4.

Referring to FIGS. 8 and 10, the data generation circuit 400B of the duty cycle correction circuit may generate the unit pattern data DAT_MS based on the selection modes #1, #2, #3, and #4. The unit pattern data DAT_MS corresponding to the selection mode #1 for a duty measurement operation on the first strobe clock signal CLK0 have logic levels "HLLL." In this case, "H" may correspond to measurement data.

Accordingly, upon duty measurement operation, the data generation circuit 400B may continuously generate the unit pattern data DAT_MS having the logic levels "HLLL" in the selection mode #1. Next, the data alignment circuit 100B may generate the up-driving data DAT_AL_U in the selection mode #1, obtained by aligning the unit pattern data DAT_MS based on the first strobe clock signal CLK0. At this time, the clock generation circuit 300B of FIG. 8 might selectively generate only the first strobe clock signal CLK0 based on the selection control signal CTR_ST. Furthermore, the correction value generation circuit 300B may generate the first saved value SV0 through a charging operation and a counting operation based on the up-driving data DAT_AL_U in the selection mode #1.

When the selection mode #1, that is, the duty measurement operation on the first strobe clock signal CLK0, is completed, the selection mode #2, that is, a duty measurement operation on the second strobe clock signal CLK45, may be performed. In the selection mode #2, the unit pattern data DAT_MS may have logic levels "LHLL." When the selection mode #2 is completed, the selection mode #3 and the selection mode #4 may be sequentially performed. In the selection mode #3, that is, a duty measurement operation on the third strobe clock signal CLK90, the unit pattern data DAT_MS may have logic levels "LLHL." In the selection mode #4, that is, a duty measurement operation on the fourth strobe clock signal CLK135, the unit pattern data DAT_MS may have logic levels "LLLH."

Next, the storage circuit 220B of FIG. 9 may generate the first to fourth saved values SV0, SV45, SV90, and SV135 based on charging operations and counting operations corresponding to the selection modes #1, #2, #3, and #4, respectively. Furthermore, the mean calculation circuit 230B may generate the duty correction value CTR_CR based on the first to fourth saved values SV0, SV45, SV90, and SV135. Furthermore, the clock generation circuit 300B of FIG. 8 may identically correct the duty ratios of the first to fourth strobe clock signals CLK0, CLK45, CLK90, and CLK135 based on the duty correction value CTR_CR.

Figure 11:
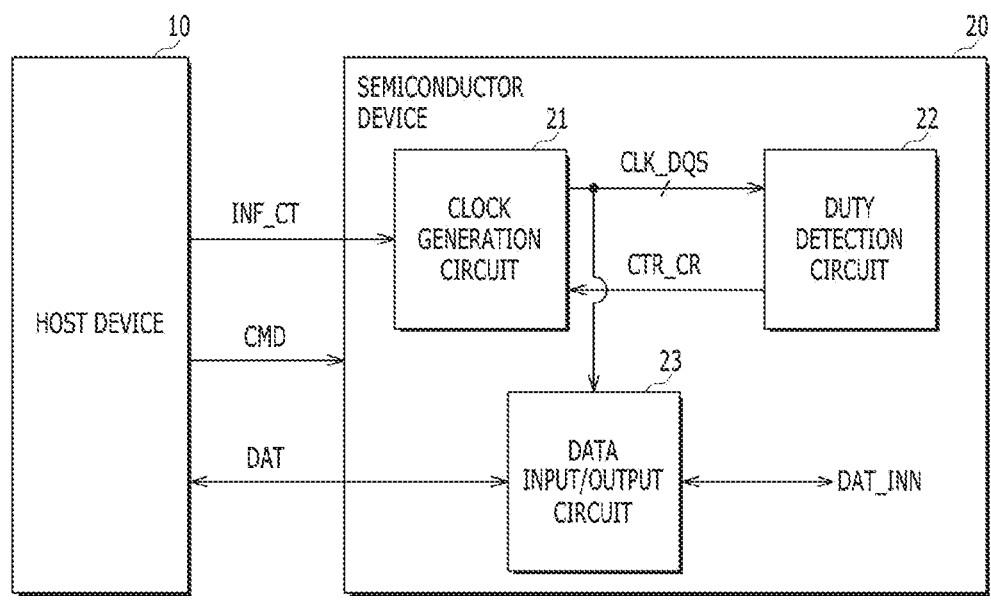
FIG. 11 is a block diagram illustrating a configuration of a semiconductor system to which the semiconductor device described with reference to FIGS. 1 to 10 is applied.

FIG. 11 is a block diagram for illustrating a configuration of a semiconductor system to which the semiconductor device described with reference to FIGS. 1 to 10 is applied.

Referring to FIG. 11, the semiconductor system may include a host device 10 and a semiconductor device 20.

First, the host device 10 is an element for controlling the semiconductor device 20, and may provide a command signal CMD, data DAT, and system clock information INF_CT to the semiconductor device 20. If the host device 10 intends to store the output data DAT, the host device 10 may additionally provide address information corresponding to the place where the data DAT will be stored.

In this case, the system clock information INF_CT may include clock frequency information used in the host device 10 and clock count information used upon alignment operation for input and output data. As described above, a clock used to align data may be diverse as seen in FIGS. 1, 4, and 8. Accordingly, the host device 10 may provide its own clock frequency information and clock count information to the semiconductor device 20 as the system clock information INF_CT.

The semiconductor device 20 may be an element for generating a strobe clock signal CLK_DQS based on the system clock information INF_CT, continuously receiving unit pattern data into which at least one measurement data has been inserted and aligning the unit pattern data based on the strobe clock signal CLK_DQS, upon duty measurement operation, and generating a duty correction value CTR_CR for correcting the duty ratio of the strobe clock signal CLK_DQS through a charging operation and a counting operation using the aligned measurement data.

In this case, the semiconductor device 20 may include a clock generation circuit 21, a duty detection circuit 22, and a data input/output circuit 23.

First, the clock generation circuit 21 may be an element for generating the corresponding number of strobe clock signals CLK_DQS as a corresponding clock frequency based on the system dock information INF_CT. The clock generation circuit 21 may generate the strobe dock signal CLK_DQS based on the system clock information INF_CT, as illustrated in FIG. 1, may generate the first strobe clock signal CLK_DQS_R and the second strobe clock signal CLK_DQS_F as illustrated in FIG. 4, and may generate the first to fourth strobe clock signals CLK0, CLK45, CLK90, and CLK135 as illustrated in FIG. 8.

The duty detection circuit 22 may align measurement data, inserted into unit pattern data, based on the strobe clock signal CLK_DQS generated by the clock generation circuit 21 upon duty measurement operation. The duty detection circuit 22 may generate the duty correction value CTR_CR through a charging operation and a counting operation using the aligned measurement data. Since a detailed configuration and operation for generating the duty correction value CTR_CR have been described with reference to FIGS. 1 to 10, detailed contents thereof may be omitted.

The duty correction value CTR_CR generated by the duty detection circuit 22 may be provided to the clock generation circuit 21. Furthermore, the clock generation circuit 21 may correct the duty ratio of the strobe clock signal CLK_DQS based on the duty correction value CTR_CR.

Upon normal operation, the data input/output circuit 23 may transmit the data DAT, provided by the host device 10, as internal data DAT_INN based on the corrected strobe clock signal CLK_DQS. The data input/output circuit 23 may transmit the internal data DAT_INN to the host device 10 based on the strobe dock signal CLK_DQS.

In the semiconductor system according to an embodiment, the semiconductor device 20 may operate by generating the strobe dock signal CLK_DQS having the same frequency and number as those of the host device 10, based on the system clock information INF_CT provided by the host device 10. Accordingly, the semiconductor system according to an embodiment can improve operation efficiency of the host device 10 and the semiconductor device 20 because the host device 10 and the semiconductor device 20 operate as a single unified system.

Furthermore, in the semiconductor system according to an embodiment, upon normal operation, the semiconductor device 20 can provide the host device 10 with the data DAT having high reliability, based on the strobe clock signal CLK_DQS having a duty ratio of 50:50. Accordingly, the host device 10 can improve reliability for a data processing operation.

According to an embodiment, although the frequency of a strobe clock signal is increased, the duty ratio of the strobe clock signal can be measured more easily and accurately. Furthermore, reliability of data synchronized with a strobe clock signal can be improved because a stable duty ratio of the strobe clock signal is secured through a measured duty correction value.

According to an embodiment, a loss rate between data can be minimized by minimizing a clock strain factor between a plurality of strobe clock signals because the plurality of strobe clock signals can be complementarily compared and analyzed.

According to an embodiment, a separate clock generation circuit for generating a counting clock is not necessary because a separate clock is not required upon counting operation of measuring the duty ratio of a strobe clock signal. Accordingly, the design area of a duty cycle correction circuit can be minimized and the entire layout area of a semiconductor device including the duty cycle correction circuit can be reduced.

Although various embodiments have been described for illustrative purposes, it will be apparent to those skilled in the art that various changes and modifications may be made without departing from the spirit and scope of the disclosure as defined in the following claims.

What is claimed is:

1. A duty cycle correction circuit comprising:
a data alignment circuit suitable for receiving unit pattern data into which at least one measurement data has been inserted and aligning the unit pattern data based on a strobe clock signal;
a correction value generation circuit suitable for counting a section from time at which a duty measurement operation is entered to time at which charges for charging corresponding to the measurement data aligned by the data alignment circuit are stored by a preset value and outputting the section as a duty correction value; and
a clock generation circuit suitable for generating the strobe clock signal and correcting a duty ratio of the strobe clock signal based on the duty correction value.

2. The duty cycle correction circuit according to claim 1, further comprising a data generation circuit suitable for continuously generating the unit pattern data upon the duty measurement operation.

3. The duty cycle correction circuit according to claim 1, wherein the correction value generation circuit comprises:
an input circuit suitable for receiving the aligned measurement data and generating charging data in an enable section of an enable signal;
a charging circuit suitable for storing the charges for charging corresponding to the charging data output by the input circuit;
a detection circuit suitable for detecting time at which the charges for charging stored in the charging circuit are stored by the preset value and controlling the enable signal; and
a processing circuit suitable for generating the duty correction value by comparing, with a preset reference counting value, a measurement counting value obtained by counting the aligned measurement data input during the enable section of the enable signal.

4. The duty cycle correction circuit according to claim 3, wherein the processing circuit comprises:
is a counting circuit suitable for generating the measurement counting value through a counting operation based on the charging data;
a setting circuit suitable for setting the reference counting value corresponding to the preset value; and
a comparison circuit suitable for generating the duty correction value by comparing the measurement counting value with the reference counting value.

5. A duty cycle correction circuit comprising:
a data alignment circuit suitable for receiving unit pattern data into which at least one measurement data has been inserted in response to first and second strobe clock signals corresponding to a rising edge and falling edge of a strobe clock signal, respectively, and aligning the unit pattern data based on the first and second strobe clock signals, respectively;
a correction value generation circuit suitable for counting a section from time at which a duty measurement operation is entered to time at which charges for charging corresponding to the measurement data aligned by the first and second strobe clock signals, respectively, are stored by a preset value and outputting the counted section as a duty correction value; and
a clock generation circuit suitable for generating the first and second strobe clock signals and correcting duty ratios of the first and second strobe clock signals based on the duty correction value.

6. The duty cycle correction circuit according to claim 5, further comprising a data generation circuit suitable for continuously generating the unit pattern data corresponding to the first and second strobe clock signals, respectively, during the duty measurement operation.

7. The duty cycle correction circuit according to claim 5, wherein the correction value generation circuit comprises:

a first measurement value generation circuit suitable for generating a first measurement counting value based on up-driving data corresponding to the first strobe clock signal;

a second measurement value generation circuit suitable for generating a second measurement counting value based on down-driving data corresponding to the second strobe clock signal; and a mean calculation circuit suitable for generating the duty correction value by analyzing a mean value of the first measurement counting value and the second measurement counting value.

8. The duty cycle correction circuit according to claim 7, wherein each of the first and second measurement value generation circuits comprises:

an input circuit suitable for receiving the aligned measurement data and generating charging data in an enable section of an enable signal;

is a charging circuit suitable for storing the charges for charging corresponding to the charging data output by the input circuit;

a detection circuit suitable for detecting time at which the charges for charging stored in the charging circuit are stored by the preset value and controlling the enable signal; and a counting circuit suitable for generating a corresponding measurement counting value by counting the aligned measurement data input during the enable section of the enable signal.

9. A duty cycle correction circuit comprising:

a data alignment circuit suitable for continuously receiving unit pattern data into which at least one measurement data has been inserted, based on a plurality of strobe clock signals having different phases, respectively, and aligning the unit pattern data based on the plurality of strobe dock signals, respectively;

a correction value generation circuit suitable for counting a section from time at which a duty measurement operation is entered to time at which charges for charging corresponding to the measurement data aligned by the plurality of strobe clock signals, respectively, are stored by a preset value and outputting the counted section as a duty correction value; and a clock generation circuit suitable for generating the plurality of strobe clock signals and correcting duty ratios of the plurality of strobe clock signals based on the duty correction value.

10. The duty cycle correction circuit according to claim 9, wherein the plurality of strobe clock signals are sequentially enabled for a burst length operation.

11. The duty cycle correction circuit according to claim 9, further comprising a data generation circuit suitable for continuously generating any of the unit pattern data corresponding to the plurality of strobe clock signals, respectively, based on a selection mode.

12. The duty cycle correction circuit according to claim 9, wherein the clock generation circuit generates any one of the plurality of strobe dock signals based on a selection mode.

13. The duty cycle correction circuit according to claim 9, wherein the correction value generation circuit comprises:

a measurement value generation circuit suitable for generating a measurement counting value for the aligned data corresponding to a corresponding strobe clock signal for duty measurement among the plurality of strobe clock signals;

a storage unit suitable for storing the measurement counting to values corresponding to each of the plurality of strobe clock signals based on a selection mode; and a mean calculation circuit suitable for generating the duty correction value by analyzing a mean value of saved values stored in the storage unit.

14. The duty cycle correction circuit according to claim 13, wherein the measurement value generation circuit comprises:

an input circuit suitable for receiving the aligned measurement data and generating charging data in an enable section of an enable signal;

a charging circuit suitable for storing the charges for charging corresponding to the charging data output by the input circuit;

a detection circuit suitable for detecting time at which the charges for charging stored in the charging circuit are stored by the preset value and controlling the enable signal; and a counting circuit suitable for generating a corresponding measurement counting value by counting the aligned measurement data input during the enable section of the enable signal.

15. The duty cycle correction circuit according to claim 9, wherein the selection mode selects a next strobe dock signal in a corresponding strobe clock signal based on the enable signal.

16. A semiconductor system comprising:

a host device suitable for outputting a command signal and data and providing system clock information; and a semiconductor device suitable for generating a strobe clock signal based on the system clock information, continuously receiving unit pattern data, into which at least one measurement data has been inserted and aligning the unit pattern data based on the strobe clock signal, upon a duty measurement operation, and generating a duty correction value for correcting a duty ratio of the strobe clock signal through a charging operation and a counting operation using the aligned measurement data.

17. The semiconductor system according to claim 16, wherein the system clock information comprises clock frequency information used in the host device and clock count information used upon an alignment operation for input/output data.

18. The semiconductor system according to claim 17, wherein the semiconductor device comprises:

a clock generation circuit suitable for generating the strobe dock signal based on the system clock information and correcting the duty ratio of the strobe clock signal based on the duty correction value;

a duty detection circuit suitable for generating the duty correction value through the charging operation and the counting operation using the aligned measurement data and providing the generated duty correction value to the clock generation circuit, during the duty measurement operation; and a data input/output circuit suitable for inputting and outputting data based on the strobe clock signal upon normal operation.

* * * * *